United States Patent
Street et al.

(10) Patent No.: US 6,791,198 B2
(45) Date of Patent: Sep. 14, 2004

(54) METHOD AND APPARATUS FOR GATE BLOCKING X-OUTS DURING A MOLDING PROCESS

(75) Inventors: Bret K. Street, Meridian, ID (US); Casey L. Prindiville, Nampa, ID (US); Cary Baerlocher, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 10/328,896

(22) Filed: Dec. 24, 2002

(65) Prior Publication Data

US 2003/0088977 A1 May 15, 2003

Related U.S. Application Data

(62) Division of application No. 09/552,409, filed on Apr. 19, 2000, now Pat. No. 6,523,254.

(51) Int. Cl.[7] ............................................. H01L 23/48
(52) U.S. Cl. ...................................... 257/786; 257/687
(58) Field of Search .................................. 257/687, 787; 29/841, 831, 832, 854, 564.1, 740, 827; 264/272.14, 272.15

(56) References Cited

U.S. PATENT DOCUMENTS

| | | | |
|---|---|---|---|
| 5,049,055 A | 9/1991 | Yokoyama | 425/116 |
| 5,175,007 A | 12/1992 | Elliott | 425/129.1 |
| 5,556,647 A | 9/1996 | Abe et al. | 425/127 |
| 5,624,691 A | 4/1997 | Bednarz et al. | 425/116 |
| 5,744,083 A | 4/1998 | Bednarz et al. | 264/272.14 |
| 5,750,059 A | 5/1998 | Bandoh | 264/39 |
| 5,846,477 A | 12/1998 | Hotta et al. | 264/511 |
| 6,173,490 B1 | 1/2001 | Lee et al. | 29/841 |
| 6,243,945 B1 | 6/2001 | Fujimoto et al. | 29/841 |
| 6,355,199 B1 | 3/2002 | Briar et al. | 264/272.13 |

*Primary Examiner*—David A. Zarneke
(74) *Attorney, Agent, or Firm*—Fletcher Yoder

(57) ABSTRACT

A method and device for providing a gate blocking material. Specifically, a method for molding a substrate having known good and bad sites thereon, by blocking the gate area of the bad sites during the molding process. A blocking material or an injection pin are used to interrupt the flow of molding compound through an injection molding system, and thereby prevent molding compound from flowing onto the known bad substrate sites.

4 Claims, 4 Drawing Sheets

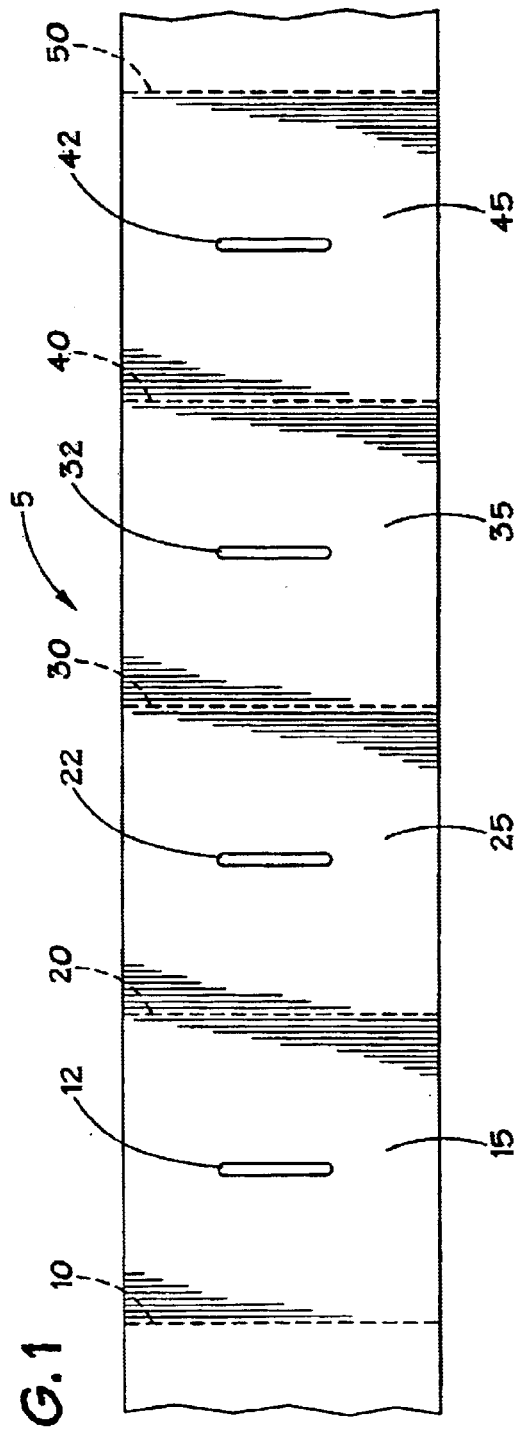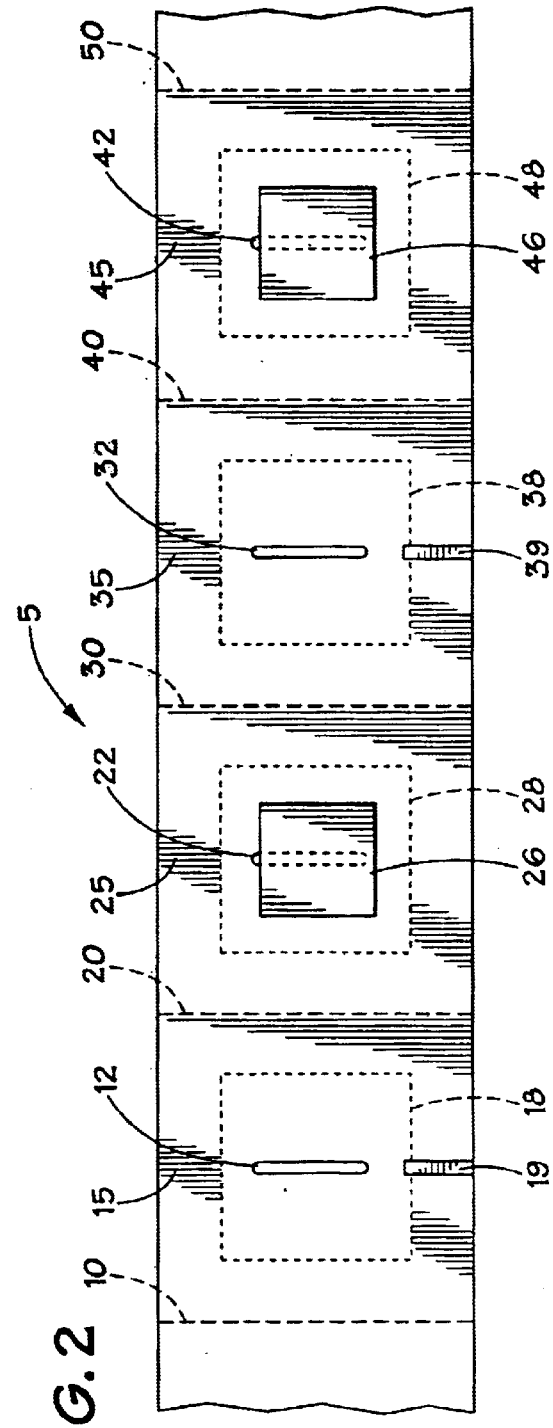
FIG.1
FIG.2

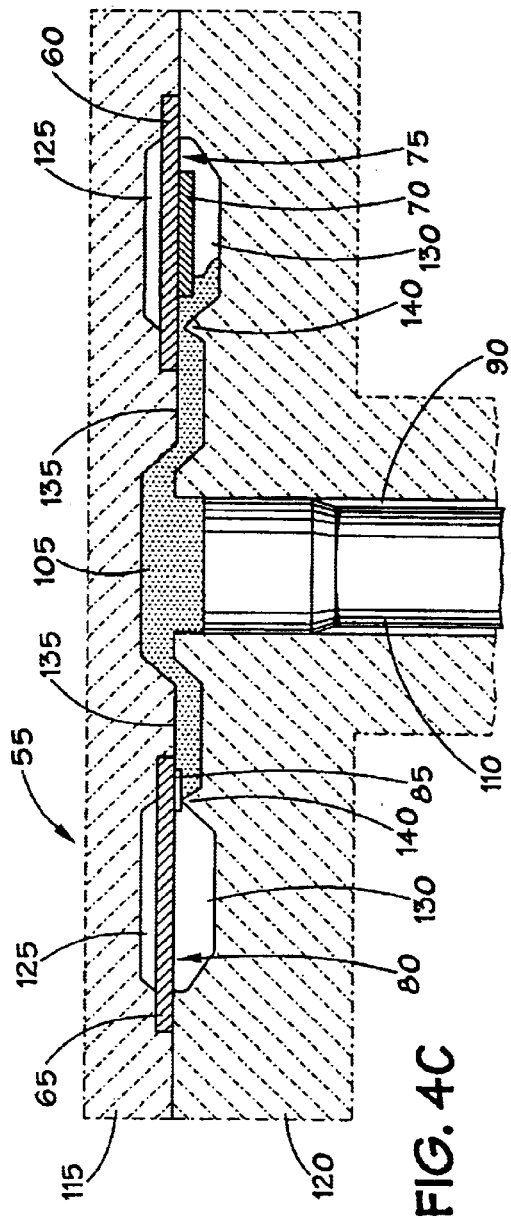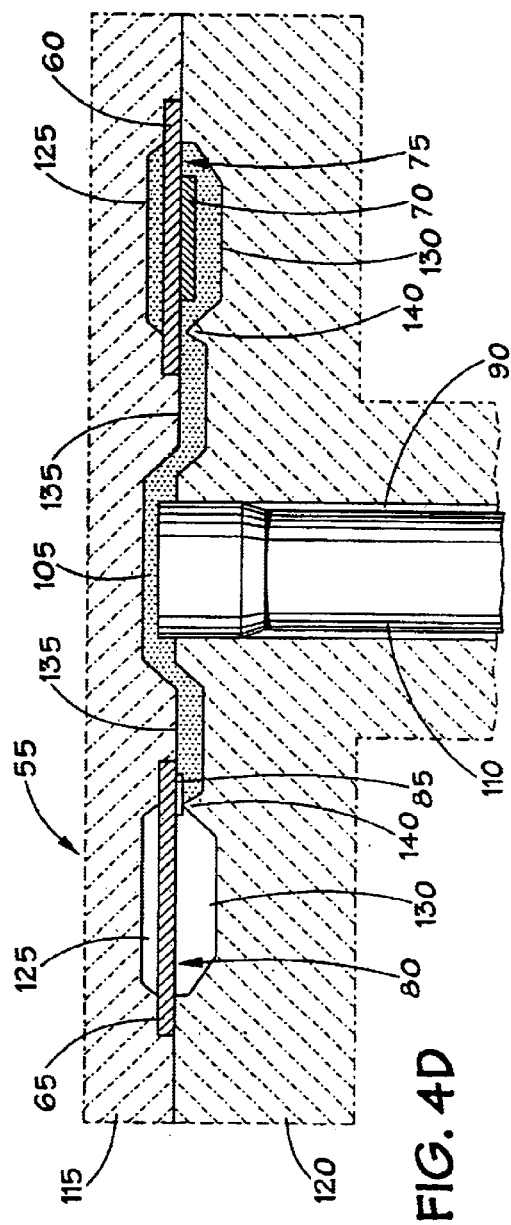

METHOD AND APPARATUS FOR GATE BLOCKING X-OUTS DURING A MOLDING PROCESS

This is a division of application Ser. No. 09/552,409 filed Apr. 19, 2000 now U.S. Pat. No. 6,523,254.

BACKGROUND OF THE INVENTION

1. Field of the Invention

The present invention relates generally to microelectronic packaging and, more particularly, to molding an integrated circuit device.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled circuits are used in a wide variety of applications. Such applications include personal computers, control systems, telephone networks, and a host of consumer products. As is well known, microprocessors are essentially generic devices that perform specific functions under the control of a software program. This program is stored in a memory device coupled to the microprocessor.

Devices in these types of circuits are typically formed on a semiconductor die and placed together in what is known in the art as a package. Many electrical circuits are packaged for surface mounting. Fine-Pitch Surface Mount Technology (FPT), Pin Grid Array (PGA) technology, and Ball Grid Array (BGA) technology are well developed areas of this type packaging.

The packaging of electrical circuits is a key element in the technological development of any device containing electrical components. A single integrated circuit die is typically encapsulated within a sealed package to be mounted on a printed circuit board (PCB) or another suitable apparatus for incorporation into a system. The integrated circuit die is generally encapsulated within a molding compound to protect the die from external contamination or physical damage. Because the integrated circuit die is encapsulated, the integrated circuit package also provides a system of interconnects for electrically coupling the integrated circuit die to a PCB or other external device.

Three common techniques for mounting an integrated circuit die on a substrate include Chip-on-Board (COB), Board-on-Chip (BOC), and Flip-Chip (F/C) technologies. In a COB package, the integrated circuit die may be attached to the substrate "face-up." That is to say that the side of integrated circuit die containing the bond pads for wire bonding the integrated circuit die to the substrate is left exposed. This side is often referred to as the upper surface of the die. The backside of the integrated circuit die not containing the bond pads is adhered to the substrate. In this type of package, bond wires are attached from the upper surface of the integrated circuit die and to pads on the upper surface of the substrate to electrically couple the integrated circuit die to the substrate. The substrate contains electrical routing which routes the signals from the upper surface of the substrate to the underside of the substrate.

Alternately, the integrated circuit die may be mounted on the substrate "face-down" to create a BOC. In this instance, the substrate typically contains a slot. Since the integrated circuit die is mounted face down, the bond pads on the upper surface of the die are arranged to correlate with the slot opening in the substrate. Bond wires are attached from the bond pads on the die, through the slot in the substrate, and to the underside of the substrate. The substrate contains electrical routing to distribute electrical signals along the backside of the substrate.

For F/C packages, the integrated circuit die is mounted on the substrate face-down as in the BOC package. For a F/C package, bond wires are not used to electrically couple the integrated circuit die to the substrate. Instead, solder bumps located on the face of the integrated circuit die are aligned with conductive pads on the upper surface of the substrate. The solder bumps may be reflowed to electrically couple the integrated circuit die to the substrate. The substrate contains electrical routing to distribute electrical signals from the die along the backside of the substrate.

Regardless of whether COB, BOC, or F/C mounting techniques are used, the package is generally encapsulated in a molding compound to protect the integrated circuit device and bond wires from external elements such as moisture, dust, or impact. A injection molding system may be used to dispose a molding compound about the package. In this type of system, a molding compound is injected through a runner and onto the package via a gate area.

Typically, a substrate, which usually has several sites, is provided by a substrate manufacturer. Each site is configured to receive an integrated circuit device, such as a memory device. Once the molding process is complete, the substrate is singulated to provide individual integrated circuit (I/C) packages. Due to processing defects, one or more sites on the substrate may be defective. These defective sites are commonly referred to as "X-outs." When the substrate is populated with I/C devices, the X-outs may be left free of I/Cs. The substrate, whose good sites are populated with I/C devices, is mounted into the injection molding apparatus to encapsulate the packages. During the molding process, molding plates may provide flow paths for the molding compound. One problem associated with the molding process is that the molding compound often "flashes" at the X-outs. That is to say that the molding compound often bleeds out of the packaging area and through the injection molding tooling. The excess molding compound left in the injection molding system may cause defects in the molding of future I/C packages, thus resulting in the failure of parts that would otherwise have been functionally good parts.

The present invention may address one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one embodiment of the present invention, there is provided a method of molding a substrate comprising the acts of: providing a substrate having a plurality of sites, each site having a gate area and being configured to receive an integrated circuit device; testing the substrate to identify bad sites; disposing a material on the gate area of each bad site; disposing an integrated circuit device on each good site; disposing the substrate onto a molding apparatus; injecting a molding compound through a runner in the molding apparatus; and disposing the molding compound on only the good sites.

In accordance with another embodiment of the present invention, there is provided a method of molding a substrate comprising the acts of: providing a substrate having a plurality of sites, each site having a gate area and being configured to receive an integrated circuit device; testing the substrate to identify bad sites; disposing an integrated circuit device on each good site; disposing the substrate onto a molding apparatus; inserting blocking pins on the gate area of each bad site; injecting a molding compound through a runner in the molding apparatus; and disposing the molding compound on only the good sites.

In accordance with yet another aspect of the present invention, there is provided a method of manufacturing a package comprising the acts of: providing a substrate having a die site and a gate area; and disposing a material on the gate area to block mold compound from entering the die site.

In accordance with still another embodiment of the present invention, there is provided a substrate having at least one die site having a gate area and having a material disposed onto the gate area to block mold compound from entering the die site.

In accordance with a further embodiment of the present invention, there is provided a molding system having a first plate and a second plate. The second plate is adapted to be disposed proximate to the first plate to create a runner having a gate area. The molding system also has at least one blocking pin connected to either the first plate or the second plate. The blocking pin is moveable to block a molding compound from passing through the gate area.

In accordance with still a further embodiment of the present invention, there is provided a plurality of at least one package. The package consists of a substrate having at least one good site and at least one bad site. There are integrated circuit devices disposed only on each good site. A molding compound disposed only on each good site.

BRIEF DESCRIPTION OF THE DRAWINGS

The foregoing and other advantages and features of the invention will become apparent upon reading the following detailed description and upon reference to the drawings in which:

FIG. 1 illustrates a top view of an exemplary BOC substrate;

FIG. 2 illustrates a top view of a BOC substrate in accordance with the present invention;

FIGS. 4A–4D illustrate a cross-sectional side view of an injection molding system at various stages during a molding process taken along line 4—4 of FIG. 3.

DETAILED DESCRIPTION OF SPECIFIC EMBODIMENTS

Figure 3:
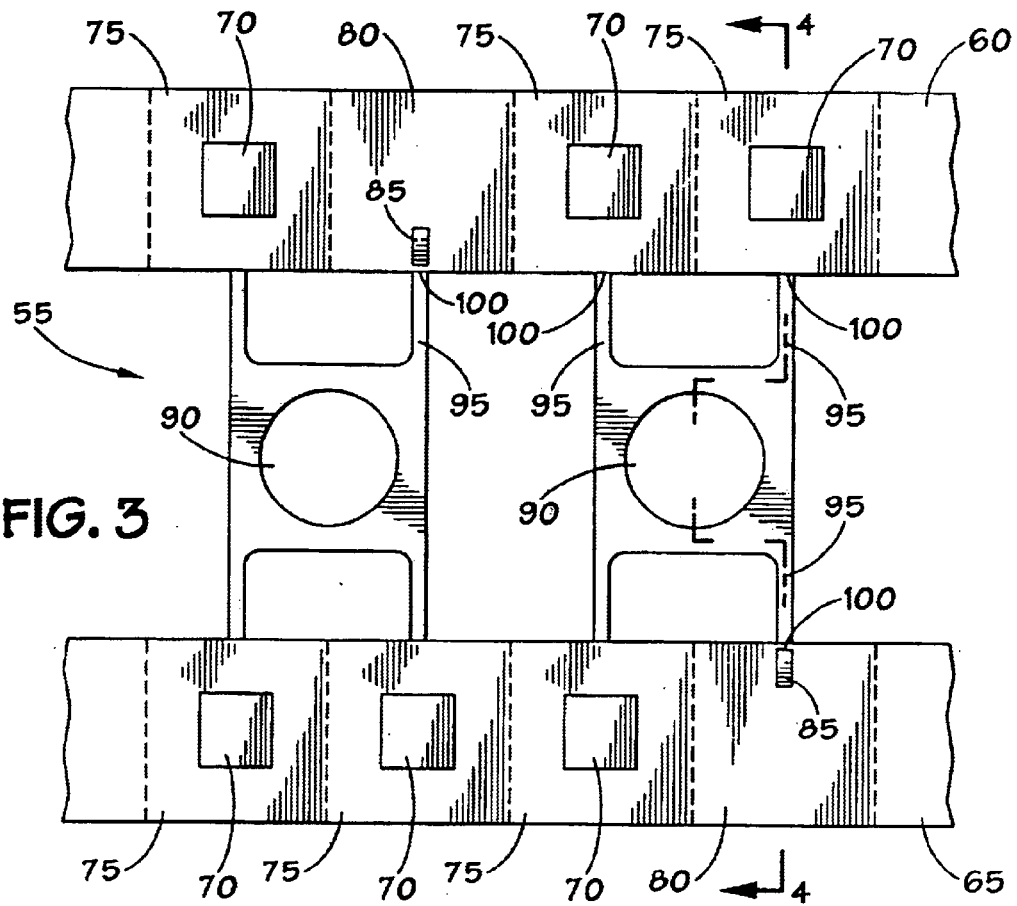
FIG. 3 illustrates a bottom plan view of an injection molding system in accordance with the present invention.

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Turning now to the drawings, and referring initially to FIG. 1, a top view of a typical substrate 5 is illustrated. The substrate 5 is configured to receive a plurality of integrated circuit devices and, thus, is configured with a plurality of identical substrate sites 15, 25, 35 and 45. Each site 15, 25, 35 and 45 contains conductive traces (not shown) to distribute electrical signals from an integrated circuit device (shown in FIG. 2) along the backside of the substrate 5. Here, four sites 15, 25, 35 and 45 are shown, but it should be evident that a substrate containing more or less sites may also be used. Each site is bounded by lines 10, 20, 30, 40 and 50. Because the substrate 5 in this example is depicted as a BOC substrate, each site 15, 25, 35 and 45 has a slot 12, 22, 32, and 42, respectively, cut therethrough. The slots 12, 22, 32 and 42 facilitate electrical coupling of the integrated circuit devices to the substrate 5 via bond wires (not shown). It should be clear, however, that the slots 12, 22, 32 and 42 may not be present if other surface mounting techniques, such as COB or F/C techniques, are used in accordance with the teachings set forth herein.

When a substrate is received from a substrate manufacturer, it may have one or more defective sites, also referred to as "X-outs." Because these sites are unusable, it is not necessary to attach an integrated circuit device to the bad sites. FIG. 2 illustrates a top view of a BOC substrate 5 in accordance with the present invention. For the sake of clarity, elements similar to the elements previously described will be designated by like reference numerals. Thus, the sites 15, 25, 35 and 45, the boundary lines 10, 20, 30, 40 and 50, and the slots 12, 22, 32 and 42 are illustrated. In this particular illustration, assume that sites 15 and 35 are known bad sites or X-outs, so integrated circuit devices 26 and 46 are only attached to the good sites 25 and 45, respectively. For a BOC substrate, the integrated circuit devices 26 and 46 are typically attached to the substrate 5 by an adhesive, such as tape. In this BOC example, the integrated circuit devices 26 and 46 are attached so as to leave an opening at the end of the slots 22 and 42 to facilitate molding of the backside and frontside of the integrated circuit packages, as discussed with reference to FIGS. 4A–4D. Package boundaries 18, 28, 38 and 48 indicate where the packages will be singulated into individual packages, typically by a saw process, after the molding process is complete.

The X-outs 15 and 35 do not receive integrated circuit devices. However, because the entire substrate 5 is processed in the molding apparatus (further discussed in FIGS. 3 and 4A–4D), a molding compound is typically disposed on all sites, including the bad sites 15 and 35. Disadvantageously, this may cause flashing and possibly processing anomalies resulting in future integrated circuit device failures. To mitigate the flashing which results from encapsulating a substrate site without an integrated circuit device mounted thereon, the gate area of the substrate may be blocked. In one embodiment, the gate area may be blocked by a single-sided adhesive tape, for example, although any resilient material which can withstand the processing temperatures associated with the molding process without losing integrity may be used to block the gate area and thus reduce the bleedout of the molding compound. As illustrated in FIG. 2, in one embodiment, a gate blocking material 19 and 39 is disposed on the gates of the respective X-outs 15 and 35 of the substrate 5.

FIG. 3 illustrates the bottom view of an injection molding system 55. For the sake of clarity, discussion of repetitive figure elements is limited with new reference numerals used to simplify the description. In this embodiment, each substrate 60 and 65 is configured to accept a plurality of integrated circuit devices 70. An integrated circuit device 70 is attached to each known good substrate site 75. The known bad sites or X-outs 80 do not receive integrated circuit devices 70, but instead are disposed with a gate blocking material 85. After the molding process, each substrate 60 and 65 is removed from the system and the individual packages will be singulated by a saw process, for instance.

The cull area 90 in the injection molding system 55 provides an area in which to hold the molding compound which will be melted and disposed about the package. As described with reference to FIGS. 4A–4D, a tablet of molding compound disposed in the cull area 90 is heated and forced through the injection molding system. The molding compound flows through the runner 95 onto the surface of the substrate 60 and 65 and through the gate area 100, unless the molding compound is impeded by the gate blocking material 85. While the upper and lower molding cavity plates are not illustrated, it should be clear from FIGS. 4A–4D that the flow of the molding compound is limited by the cavity plates to flow in only desired areas.

In this configuration of the injection molding system 55, a single tablet of molding compound will be used to encapsulate four devices, thus the system is set up such that each tablet will dispose molding compound on up to four sites 75. In FIG. 3, two of the eight sites illustrated are X-outs 80. Thus, the gate blocking material 85 will prevent molding compound from the system 55 from flowing onto the bad sites 80 during the encapsulation process.

At this point, it may be helpful to illustrate a simplified process flow of the injection molding system 55. FIGS. 4A–4D illustrate various stages of a typical injection molding system 55. A simplified cross-section of the system 55 described in FIG. 3, and taken along line 4—4, is illustrated. Typically, the substrates 60 and 65 are disposed onto the system 55 so that the frontside of each of the substrates 60 and 65 is face down. This will allow the surfaces of the substrates 60 and 65, on which the integrated circuit device 70 is attached, to be encapsulated first.

Initially, a tablet is placed into a cull 90 in the injection molding system 55. The tablet is a molding compound 65, typically a resin, which is heated to a melting point. As the tablet begins to melt, a plunger 110 in the injection molding system 55 forces the molding compound 105 upward. The injection molding system 55 is typically comprised of an upper molding cavity plate 115 and a lower molding cavity plate 120. Each cavity plate 115 and 120 contains cavities 125 and 130, respectively, to direct the flow of the molding compound 105 about the device 70. This particular injection molding system illustrates two substrate sites 75 and 80. The good site 75 is mounted with an integrated circuit device 70, and the X-out 80 is disposed with a gate blocking material 85. An injection molding system may be configured so that a single tablet is used to encapsulate one or more integrated circuit packages. For illustrative purposes, the present injection molding system 55 illustrates two sites 75 and 85 that may be encapsulated, simultaneously.

Figure 4A:
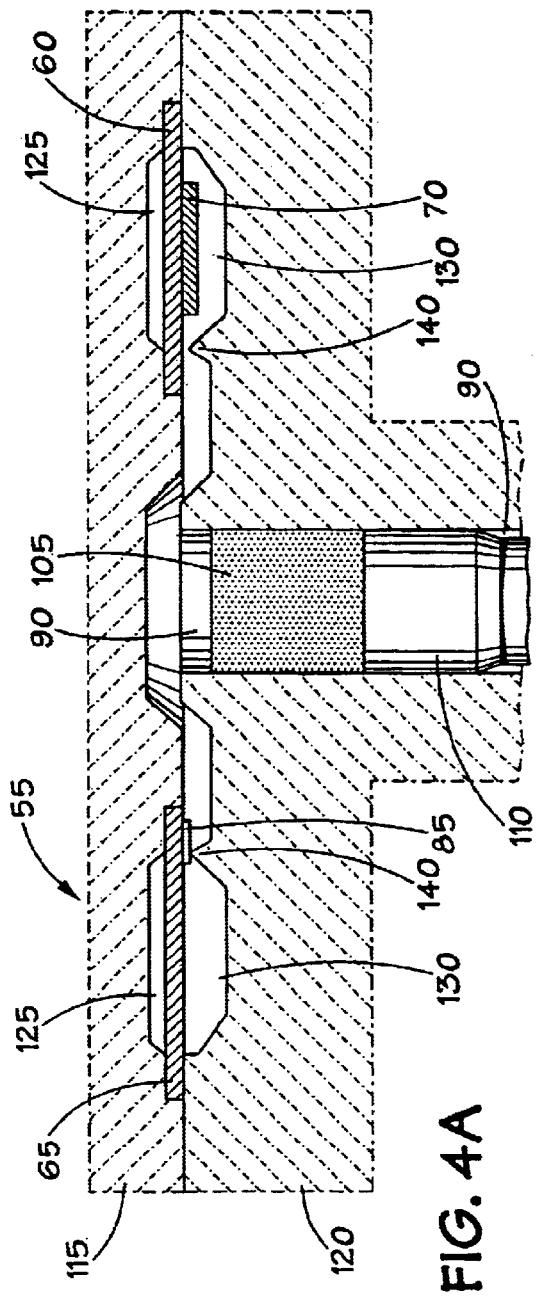
Figure 4B:
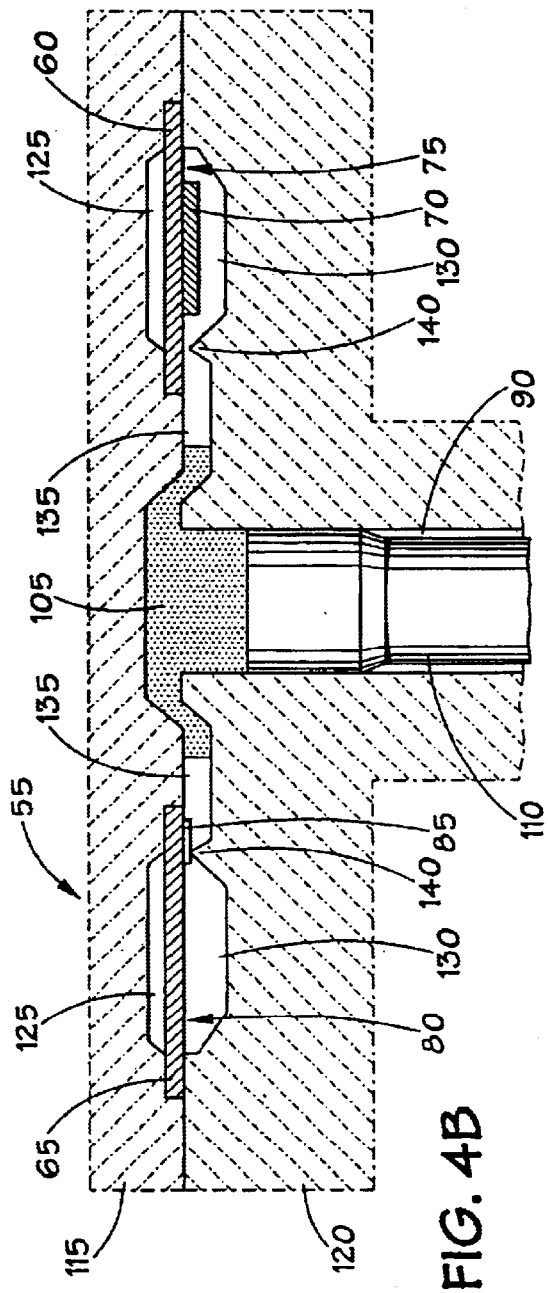

As the molding compound 105 melts, the plunger 110 forces the molding compound 105 upward through the injection system 55 and into the runner 135, as illustrated in FIG. 4B. The runner 135 provides a conduit to direct the molding compound 105 to the device 70. As the runner 135 narrows, the molding compound 105 enters the gate area 140 of the good site 75 and flows into the cavity 130 in lower cavity plate 120, as illustrated in FIG. 4C. However, for the X-out 80, the gate blocking material 85 prevents the molding compound 105 from flowing through the gate area 140 and into the cavity 130 in the lower cavity plate 120. Advantageously, because no molding compound flows into the X-out 80, this prevents the flashing resulting from injecting of the molding compound 105 onto a substrate site which does not contain an I/C device 70 (X-out 80).

For the good site 75, as the molding compound 105 is further forced through the system 55, the molding compound 105 flows through the runner 135, the gate area 140, into the lower cavity 130 through a slot (shown in FIG. 2) in the substrate 60, and into the upper cavity 135, as illustrated in FIG. 4D. The lower cavity 130 facilitates encapsulation of the I/C device 70 on the frontside of the substrate 60. The upper cavity 125 facilitates encapsulation of the bond wires (not shown), which are used to electrically couple the I/C device 70 to the substrate 60, on the backside of the substrate 60. Finally, the encapsulated substrate 60 can be removed from the injection molding system 55.

Figure 5:
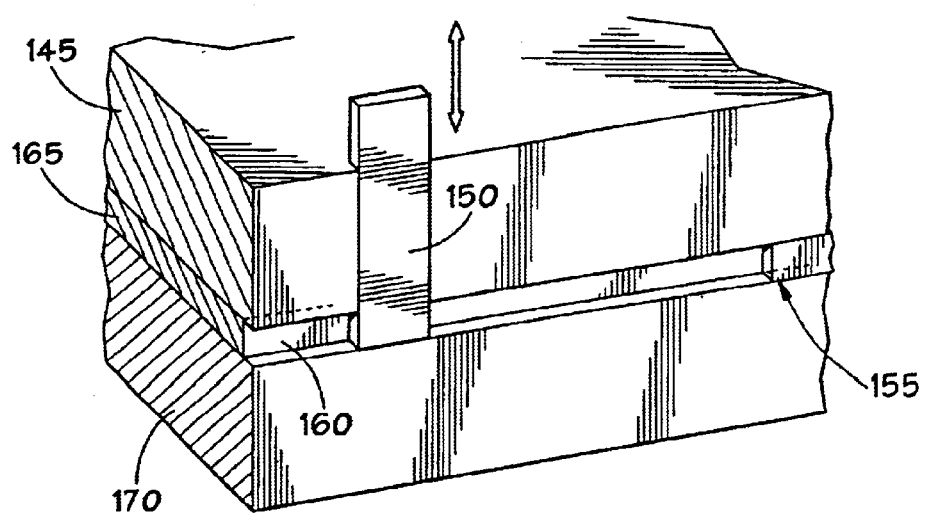
FIG. 5 illustrates an alternate embodiment of an injection molding system in accordance with the present invention.

In another embodiment, one of the cavity plates such as the upper cavity plate 145, may contain blocking pins 150 configured to block the molding compound from passing the gate area 155 as illustrated in FIG. 5. The pins 150 may be configured to mechanically eject from the cavity plate 145 to block the runner area 160 or gate area 155, from receiving the molding compound for X-out sites. As illustrated, the substrate 165 is disposed between the upper cavity plate 145 and the lower cavity plate 170. The blocking pins 150 may remain recessed within the molding cavity plate 145 for good substrate sites. To block the bad sites, the blocking pins 150 may be manually ejected into the runner area 160 or the gate area 155 or mechanically ejected by a device such as a solenoid, so that the molding compound is prevented from passing through the gate area 155 and onto the X-out.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims. Further, any variations to the adhesive patterns or any combination of the above mentioned patterns clearly fall within the spirit and scope of the invention.

What is claimed is:

1. A substrate comprising:

at least one die site having a gate area; and a material disposed onto the gate area to block mold compound from entering the die site; wherein the material comprises a strip of adhesive or a blocking pin.

2. The substrate, as set forth in claim 1, wherein the substrate comprises a board-on-chip substrate.

3. The substrate, as set forth in claim 1, wherein the substrate comprises a chip-on-board substrate.

4. The substrate, as set forth in claim 1, wherein the substrate comprises a flip-chip substrate.

* * * * *